(12) United States Patent
Leusink et al.

(10) Patent No.: US 6,302,057 B1
(45) Date of Patent: Oct. 16, 2001

(54) APPARATUS AND METHOD FOR ELECTRICALLY ISOLATING AN ELECTRODE IN A PECVD PROCESS CHAMBER

(75) Inventors: Gerrit J. Leusink, Tempe; Michael G. Ward, Phoenix, both of AZ (US); Tayler Bao, Da-Liau Kaohsiung (TW); Jerry Yeh, Gilbert, AZ (US); Joseph T. Hillman; Tugrul Yasar, both of Scottsdale, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/153,128

(22) Filed: Sep. 15, 1998

(51) Int. Cl.[7] .............................. H05H 1/00; C23C 16/00
(52) U.S. Cl. ........................ 118/723 E; 427/569
(58) Field of Search .................... 118/723 E, 723 R; 156/345; 427/569

(56) References Cited

U.S. PATENT DOCUMENTS

| | | |
|---|---|---|
| 3,369,989 | 2/1968 | Kay et al. . |
| 4,771,730 | 9/1988 | Tezuka . |
| 4,792,378 | 12/1988 | Rose et al. . |
| 4,798,165 | 1/1989 | deBoer et al. . |
| 4,897,709 | 1/1990 | Yokoyama et al. . |
| 4,971,653 | 11/1990 | Powell et al. . |
| 5,010,842 | 4/1991 | Oda et al. . |
| 5,017,403 | 5/1991 | Pang et al. . |
| 5,148,714 | 9/1992 | McDiarmid . |
| 5,273,588 | 12/1993 | Foster et al. . |
| 5,342,471 | 8/1994 | Fukasawa et al. . |
| 5,356,476 | 10/1994 | Foster et al. . |
| 5,378,501 | 1/1995 | Foster et al. . |
| 5,433,787 | 7/1995 | Suzuki et al. . |
| 5,434,110 | 7/1995 | Foster et al. . |
| 5,453,124 | 9/1995 | Moslehi et al. . |
| 5,567,243 | 10/1996 | Foster et al. . |
| 5,593,511 | 1/1997 | Foster et al. . |
| 5,595,606 | 1/1997 | Fujikawa et al. . |
| 5,610,106 | 3/1997 | Foster et al. . |
| 5,628,829 | 5/1997 | Foster et al. . |
| 5,665,640 | 9/1997 | Foster et al. . |
| 5,716,870 | 2/1998 | Foster et al. . |
| 5,855,685 * | 1/1999 | Tobe et al. .................. 118/723 I |

FOREIGN PATENT DOCUMENTS

| | | |
|---|---|---|
| 60-98629 | 6/1985 | (JP) . |
| 63-187619 | 8/1988 | (JP) . |
| 2-234419 | 9/1999 | (JP) . |

* cited by examiner

*Primary Examiner*—Thi Dang
(74) *Attorney, Agent, or Firm*—Wood, Herron & Evans, L.L.P.

(57) ABSTRACT

An apparatus for depositing a film on a substrate utilizing a plasma-enhanced chemical vapor deposition process comprises a process chamber having an electrically grounded element therein and an RF biased electrode positioned in the process chamber proximate a substrate. An insulative element is coupled between the electrode and the grounded element other than the grounded substrates, and is formed of an electrically insulative material and has an insulative surface for effectively electrically isolating the electrode from the grounded element within the process chamber. The insulative element includes at least one feature formed in the insulative surface, wherein the feature has a high effective aspect ratio for inhibiting the deposition of a film therein to thereby create an electrical discontinuity in a film which may form on the insulative surface during the plasma-enhanced chemical vapor deposition process.

15 Claims, 2 Drawing Sheets

US 6,302,057 B1

APPARATUS AND METHOD FOR ELECTRICALLY ISOLATING AN ELECTRODE IN A PECVD PROCESS CHAMBER

FIELD OF THE INVENTION

This invention relates generally to semiconductor processing and more specifically to the improvement of the operation of plasma-enhanced chemical vapor deposition (PECVD) chambers to electrically isolate electrodes therein and to reduce plasma instabilities therein.

BACKGROUND OF THE INVENTION

In the formation of integrated circuits (ICs) it is often necessary to deposit thin material layers or films, such as electrically conductive films containing metal and metalloid elements, upon the surface of a substrate, such as a semiconductor wafer. One purpose of such thin films is to provide conductive and ohmic contacts for the ICs and to yield conductive or barrier layers between the various devices of an IC. For example, a desired film might be applied to the exposed surface of a contact or via hole on an insulating layer of a substrate, with the film passing through the insulating layer to provide plugs of conductive material for the purpose of making electrical connections across the insulating layer and into the underlying layer.

One well known process for depositing such films is chemical vapor deposition (CVD), in which a film is deposited on a substrate using chemical reactions between various constituent or reactant gases, referred to generally as process gases. In CVD, process gases are pumped into the process space of a reaction chamber containing a substrate. The gases react in the process space proximate a surface of the substrate. The reaction results in the deposition of a film of one or more reaction by-products on the surface of the substrate. Other reaction by-products that do not contribute to the desired film on the exposed substrate surfaces are then pumped away or purged by a vacuum system coupled to the reaction chamber.

One variation of the CVD process, which is also widely utilized in IC fabrication, is a plasma-enhanced CVD process or PECVD process, in which one or more of the process gases is ionized with electrical energy into a gas plasma to provide energy to the reaction process. PECVD is a desirable process for lowering the processing temperatures and the amount of thermal energy that are usually necessary for a proper reaction with standard CVD. In PECVD, electrical energy is delivered to the process gas or gases to form and sustain the plasma, and therefore, less thermal energy is needed for the reaction.

Plasma-enhanced CVD uses conductive electrodes within the processing chamber which are biased with radio frequency (RF) energy sources. The electrical fields generated by the RF electrodes activate and sustain the gas plasma. In one configuration, one of the biased electrodes may be the planar susceptor or other structure supporting the substrate to be processed, while the other electrode is a planar showerhead positioned above the susceptor and substrate to introduce the process gas into the processing chamber and simultaneously excite one or more of the process gases into a plasma. Such a configuration is referred to as a parallel plate configuration because of the substantially parallel orientation of the planar susceptor and planar showerhead with the substrate positioned therebetween.

PECVD process chambers using biased showerheads generally support the showerhead above the substrate. An electrically insulative element or insulator is positioned between the biased showerhead and other metal elements in the process chamber. The insulative element is formed of an electrically insulative material, such as quartz. One end of the support is coupled to the metal lid of the chamber, and the other end is coupled to the biased showerhead. In that way, the showerhead is spaced and electrically insulated from the chamber lid. Since the metal lid of the chamber, as well as the metal chamber itself, is electrically grounded, the insulative element prevents electrical contact between the lid and showerhead and this prevents the showerhead from shorting or arcing to ground potential. In one embodiment, the support has a hollow, cylindrical shape and is used to direct the process gas to the showerhead to be dispersed during the PECVD reaction.

Due to the non-selective deposition nature of the PECVD process and the absence of directionality of the actual deposition, films will be deposited elsewhere inside the process chamber other than just on the substrate, as is desired. Specifically, parts inside the process chamber that are in proximity to the deposition area and substrate, i.e., in the vicinity of the electrodes (biased showerhead and substrate support), will be coated. When insulative parts, such as the insulative element, are coated with an electrically conducting film, the plasma and the process stability are detrimentally affected. By such coatings the effective surface areas of the electrodes are extended, and may possibly be extended to create a short to ground of one of the RF electrodes. For example, if the insulative element extending between the grounded chamber lid and the showerhead is coated, the biased showerhead may be shorted to the grounded chamber lid.

Traditionally, there have been several ways to prevent such a problem. However, the conventional solutions have other drawbacks. For example, a ground shield might be used in areas around an RF-biased element to prevent extension of the plasma into those areas and thus to prevent deposition in those areas. Ground shields rely on the Debeye sheath, or dark space sheath, which prevents a plasma from being ignited in certain areas. However, in PECVD processes, the high process pressure of 1–10 Torr requires impractically small shield-to-insulator distances (e.g., 0.1–1 mm). Another method involves frequent cleaning of the process chamber to prevent a build up of a conducting film on the insulative surfaces. However, frequent cleaning has a negative impact on the throughput or productivity of the process. Furthermore, cleaning makes it difficult to then again recover the actual PECVD process, because the PECVD process parameters must again be established anew for the post-cleaning deposition.

Accordingly, it is an objective of the present invention to have a stable plasma in a PECVD process and to prevent shorting of the RF electrodes to ground as a result of non-directional deposition.

It is another objective of the invention to provide such plasma stability while maintaining an efficient and productive PECVD process.

It is still another objective of the invention to achieve the above objectives while eliminating drawbacks associated with traditional PECVD processes.

SUMMARY OF THE INVENTION

The present invention addresses the above objectives by effectively preventing formation of a completed electrical path between a biased electrode of the chamber and a grounded surface utilized within that chamber by the film deposited in the process chamber. Specifically, the present invention creates electrical discontinuities in films formed between an electrode and a grounded surface during deposition to thereby maintain isolation of the biased electrode from ground potential and thus maintain the plasma stability. The invention is applicable to use within a PECVD chamber; however, it will also have applicability within other deposition chambers as well.

In accordance with one aspect of the present invention, an insulative element is positioned between an electrode, such as a biased showerhead, and a grounded element, such as the grounded chamber lid of the process chamber. The insulative element is formed of an electrically insulative material and has an insulative surface for effectively electrically isolating the electrode from the grounded element within the process chamber. In accordance with the principles of the present invention, the insulative element includes at least one feature formed in the insulative surface. The feature has a high effective aspect ratio for inhibiting the deposition of a film therein, to thereby create an electrical discontinuity in any film which may form on the insulative surface during the plasma-enhanced chemical vapor deposition process. Effectively, the high aspect ratio feature inhibits deposition of a physically complete and continuous film between a biased electrode and a grounded element and thus introduces physical discontinuities in the film. The physical discontinuities create electrical discontinuities and thus prevent a continuous conductive path between the biased electrode and the grounded element of the process chamber. In that way, the insulative properties of the insulative element are maintained to maintain the electrically isolated electrode and maintain a stable plasma.

In accordance with another principle of the present invention, a plurality of such high effective aspect ratio features are formed in the insulative element. The insulative element is formed of an electrically insulative material such as quartz, alumina, or aluminum nitride. The feature, in accordance with the principles of the present invention, should have an aspect ratio of at least 10. Preferably, the effective aspect ratio of the features is in the range of 10 to 20.

In a conventional PECVD process configuration, a showerhead is positioned proximate a substrate, and is biased with RF energy to act as an RF electrode. A cylindrical insulative element, commonly formed of quartz, is positioned between the showerhead electrode and the grounded lid of the process chamber. The cylindrical insulative element surrounds the periphery of the showerhead and creates a process gas space between the lid and the showerhead for receiving process gases. The process gases are introduced into the space and are dispersed through the openings in the showerhead proximate to the substrate. Within such a configuration, one embodiment of the invention utilizes a plurality of grooves formed in a surface of the cylindrical insulative element wherein the grooves are generally circular and continuous around the insulative element to form the electrical discontinuities necessary in accordance with the principles of the invention. In a preferred embodiment, a plurality of grooves are utilized therearound so that electrical discontinuity is ensured should one groove be covered by film deposition sufficient to provide an electrically conductive path across and through the groove.

In accordance with another principle of the present invention, the effective aspect ratios of the plurality of features on an insulative element may be varied as desirable for the particular deposition process.

These features and other features of the present invention will be described in greater detail hereinbelow in the Detailed Description which is set forth with reference to the figures of the application.

BRIEF DESCRIPTION OF THE FIGURES

The accompanying drawings, which are incorporated in and constitute a part of this specification, illustrate embodiments of the invention and, together with a general description of the invention given below, serve to explain the principles of the invention.

DETAILED DESCRIPTION OF THE INVENTION

Figure 1:
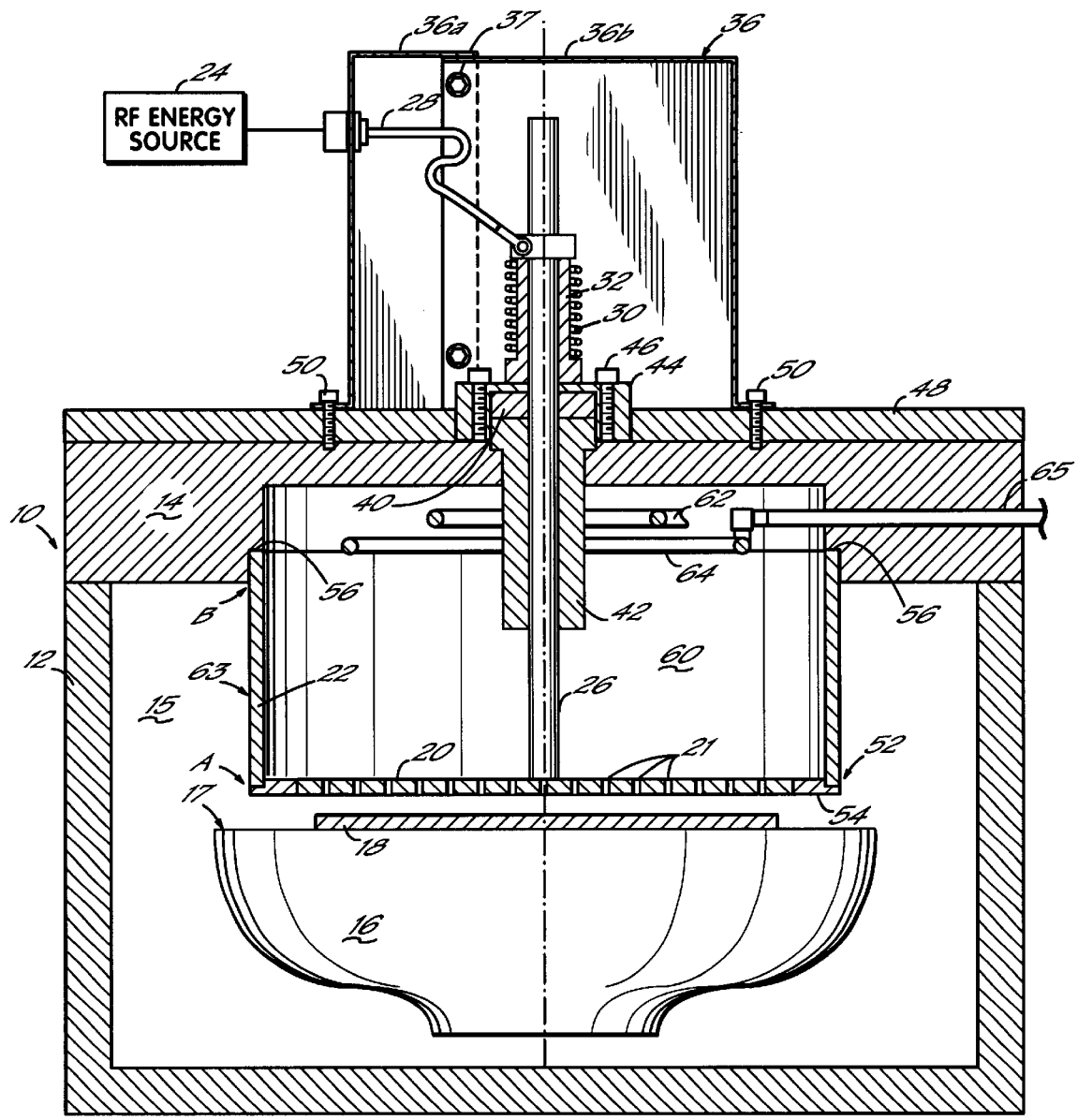
FIG. 1 is a side cross-sectional view of a prior art process chamber.

FIG. 1 illustrates a conventional CVD processing chamber which may be utilized for plasma-enhanced chemical vapor deposition (PECVD). Although the invention is described with respect to a traditional PECVD chamber and process, the invention is also applicable to other processes and process chambers utilizing electrically biased elements. Chamber 10 includes body 12 which defines a process space 15 therein. Body 12 has an open top which is covered and sealed by an appropriately formed lid 14 which may be secured to body 12 in a sealed fashion so that the processing space may be placed under a suitable vacuum for the PECVD process as is conventional. Appropriate sealing structures (not shown) are utilized between body 12 and the lid 14. The body 12 and lid 14 may be formed of a suitable metal such as stainless steel. The body and lid of process chamber 10 are electrically grounded.

Positioned within process space 15 formed by process chamber 10 is a substrate support or susceptor 16 which supports a substrate 18, such as a wafer, that is to be processed generally with plasma-enhanced chemical vapor deposition. A film layer will be deposited onto the substrate 18 with a PECVD process. As discussed above in the Background of the Invention, the layer to be applied to the substrate 18 often is electrically conductive; such as a metallic layer, and when deposited upon the substrate, will generally be deposited in a multi-directional and non-selective fashion. As such, the film will also deposit on other structures within the process chamber 11, rather than just on the substrate 18. A conductive layer then provides an electrically conductive path, such that the insulative structures and insulative surfaces in the process chamber 10 no longer provide the desired electrical isolation between electrode elements in the system.

More specifically, for plasma-enhanced CVD, one or more electrodes will be biased with RF energy. Referring to FIG. 1, a metal, planar showerhead 20 is suspended within process space 15 proximate support 16 and substrate 18. The showerhead 20 is normally formed of metal and includes a plurality of openings therein (not shown) which introduce the process gases within the process space 15 proximate substrate 18. Showerhead 20 is biased with an RF energy source 24 such that the showerhead acts as an RF electrode within the process space 15. Substrate support 16 is also usually formed of an appropriate metal and is biased or grounded to act as a second electrode. The planar shape of the showerhead 20 and the planar upper surface 17 of susceptor 16 provides two planar electrode surfaces in space 15 with substrate 18 positioned therebetween. The configuration illustrated in FIG. 1 is often referred to as a parallel plate configuration because of the parallel support surface 17 and planar showerhead electrode 20.

Showerhead 20 is coupled to and supported in space 15 by a conductive shaft 26. RF energy source 24 is coupled via line 28 to coil 30 which surrounds an upper portion of shaft 26. Shaft 26 is isolated from coil 30 by an insulative bushing 32. Through coil 30, energy from source 24 is inductively coupled to the shaft 26 and thus to showerhead 20 such that showerhead 20 operates as an RF electrode. The shaft 26, coil 30, and line 28 are all shielded by an appropriate metal shield 36, which may be in the form of two shield pieces 36a, 36b bolted together by appropriate fasteners 37. Conductive shaft 26 is further electrically isolated from the grounded metal lid 14 by additional insulative bushings 40, 42 which are held in place by an insulative cap 44 and appropriate fasteners, such as bolts 46. The bolts 46 secure the cap 44 to lid 14. A metal mounting plate 48 is appropriately coupled to lid 14 and shield 36 is fixed thereto by fasteners 50. The insulative bushings 32, 40, 42 as well as insulative cap 44 are formed of an appropriate electrically insulative material such as quartz, alumina, or aluminum nitride.

The showerhead 20 is electrically insulated from the grounded lid 14 by an insulative element or insulator 22. The insulative element 22 is shown as an insulative cylinder which extends between lid 14 and the showerhead 20. The showerhead 20 is fixed to rod 26, such as by welding and is suspended in position proximate substrate 18. The showerhead 20 is held up against the lower edge 52 of the insulative element 22. An appropriately formed shelf 54 is formed around the periphery of the showerhead electrode 20 for receiving the lower edge 52 of the insulative element 22, and centering the showerhead 20 with respect to the cylindrical element.

An upper edge 56 of the insulative element 22 fits into an appropriately formed shelf 58 in lid 14. The insulative element 22 provides electrical insulation between showerhead electrode 20 and the metal lid 14. Generally, the process chamber 10, including lid 14, will be grounded as discussed above. Therefore, the insulative element 22 prevents the RF-biased showerhead electrode 20 from shorting or arcing directly to ground through the grounded lid 14. The insulative element provides spacing of the showerhead 20 from lid 14, as well as the positioning of the showerhead 20 within the process chamber 10. Generally, the showerhead 20 will actually be held suspended above the substrate support 16 and substrate 18 by its attachment to shaft 26, and the showerhead 20 may or may not be directly affixed to the cylindrical insulative element 22. Accordingly, the insulative element 22 may not physically support showerhead 20, although it may in an alternative configuration to that shown in FIG. 1.

Insulative element 22 also provides a cylindrical process gas space 60 between lid 14 and the showerhead 20. Appropriate gas-dispersing elements, such as gas-dispersing rings 62, 64 are coupled to respective supplies of process gas (not shown), such as by line 65. The gas-dispersing rings 62, 64 introduce process gas into space 60 which then travels through appropriate openings in the showerhead 20 and is dispersed proximate substrate 18 on the substrate support 16. The RF-biased showerhead 20 acts as an electrode and excites one or more of the process gases into a plasma which is then utilized to deposit a layer of material onto substrate 18 through well-known PECVD principles. Generally, in an electrode configuration as shown in FIG. 1, using showerhead 20 and substrate support 16 as parallel electrodes, the plasma created will be generally concentrated between the electrodes and proximate substrate 18. However, the plasma will also exist elsewhere in space 15, although in a less dense state than the plasma between the electrodes. This extension of the plasma is what creates non-directional deposition throughout space 15.

As discussed above, there is generally no directionality to the deposition of the film on substrate 18 in a PECVD process. That is, the process is non-selective with respect to the layers on which the deposition occurs. The process gases are introduced proximate substrate 18 and the plasma is also excited proximate the substrate. However, deposition will also occur on surfaces throughout the process space 15 of chamber 10, because of the plasma throughout space 15. Specifically, deposition occurs on the outside surface 63 of the cylindrical insulative element 22. The inventors have discovered that such deposition reduces the insulative properties of the element 22, and thus adversely affects the stability of the plasma.

For example, during a test run of 25 PECVD deposition processes, utilizing a titanium-containing gas, it was noticed that the plasma created by electrode 20 became unstable. Upon opening the process chamber 10 for inspection of the insulative element 22, it was verified that a film had deposited on the outside surface 63 of the element 22. Since the deposition layer contained a metal, i.e., titanium, the film on surface 63 had very low resistance and thus undesirably electrically coupled the showerhead electrode 20 to the metal lid 14 of the process chamber. Upon measuring the resistance of the film on surface 63, it was determined that the resistance was only approximately 50 ohms as measured between point A and point B on the insulative element 22. Such low resistance causes the RF power from the RF energy source 24 to essentially be coupled to the grounded process chamber lid 14 which affects the plasma stability and ultimately the quality of the film deposited upon substrate 18. Electrical arcing between the lid 14 and showerhead electrode 20 may also occur and detrimentally affect the plasma. In the past, such an undesirable grounding layer was dealt with by frequent cleanings, which are inefficient and therefore expensive, or through the use of a shield around the insulative electrode support. However, as discussed above, such a shield would require shield-to-insulator distances that are impractically small (0.1–1 mm.) for typical PECVD process pressures (1–10 Torr). Further detail regarding the processing system illustrated in FIG. 1 may be obtained from U.S. Pat. No. 5,665,640 which U.S. patent is entirely incorporated by reference herein.

The present invention addresses the above-referenced problems without reducing the efficiency of the PECVD process or requiring additional complicated and precisely aligned shields within the process chamber 10.

Figures 2, 3:
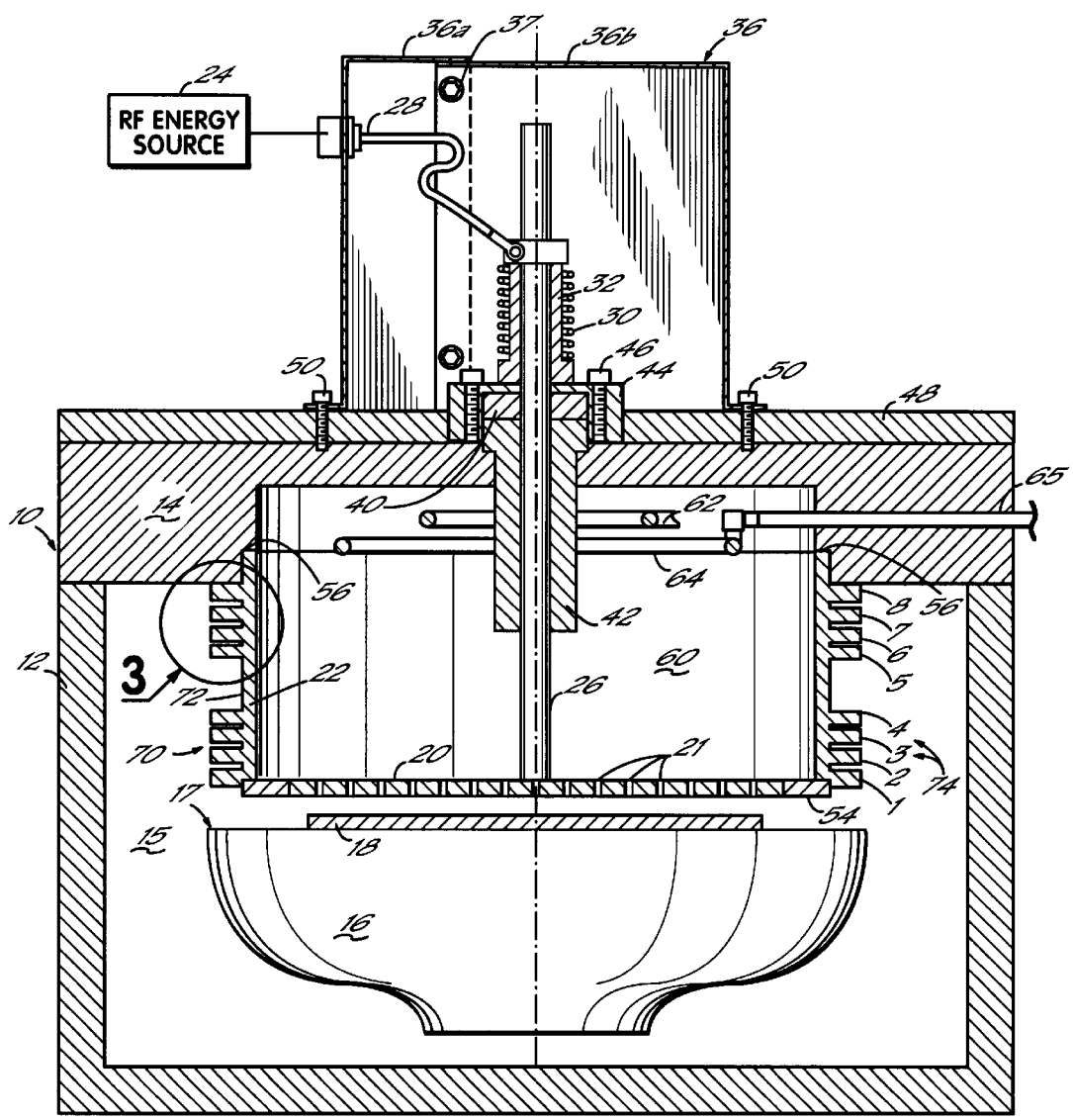
FIG. 2 is a side cross-sectional view of process chamber utilizing the present invention.
FIG. 3 is an exploded view of a section of the chamber in FIG. 2.

FIG. 2 illustrates a process chamber 10 utilizing the invention. The process chamber 10 is similar to the process chamber illustrated in FIG. 1 and the corresponding components are given the same reference numbers as those in FIG. 1.

One embodiment of the inventive insulative element 70 is shown coupled between lid 14 and showerhead 20. The embodiment of the element 70 illustrated in FIG. 2 has a generally cylindrical shape which surrounds the periphery of showerhead 20 and forms space 60 between the showerhead 20 and the lid 14 for introducing the process gases to be excited into a plasma for the PECVD process as discussed above. Element 70 is formed of an electrically insulative material similar to element 22, such as quartz, alumina, and aluminum nitride, and has an outer insulative surface 72. Similar to element 22, illustrated in FIG. 1, the insulative element 70 effectively electrically isolates the showerhead electrode 22 from lid 14 within the process chamber 10. In accordance with one aspect of the present invention, the insulative electrode support 70 includes at least one high aspect ratio feature 74 formed in the insulative surface 72. In the embodiment illustrated in the figures, the feature 74 is in the form of a groove which extends around the cylindrical electrode support 70 and has a high aspect ratio, in the order of 20 or greater, which inhibits deposition of a film into the groove.

In a preferred embodiment, the feature 74 (groove) is continuous and surrounds the electrode support 70 in a generally circular fashion on the outside surface 72. In that way, the feature 74 prevents deposition of a conductive film over the entire outer surface 72 of the electrode support 70 and thus creates an electrical discontinuity in the film. The insulative properties of the insulative element 70, which are necessary for electrically isolating the showerhead electrode, 20 from the grounded chamber lid 14, are thus maintained. As a result, plasma stability is also maintained without frequent and inefficient cleanings or the use of a plasma shield structure.

FIG. 3 illustrates the present invention and the creation of electrical discontinuities in a film deposited on the outer surface 72. Specifically, when deposition occurs by way of film 76 on surface 72, the high aspect ratio of the features or grooves 74a, 74b, 74c generally inhibits or actually prevents any deposition within the bottom surfaces 78 and side surfaces 80 of the grooves.

In that way, an electrical discontinuity is created by the grooves 74a, 74b, 74c. In other words, there is no physical continuity, and therefore, no electrical continuity between the film portion indicated at 76a and the adjacent portion of the film indicated as 76b. The groove 74a between those film portions 76a, 76b and particularly the side surfaces 80 and bottom surface 78 of the groove 74a are not completely coated with the film 76 due to the high aspect ratio of the groove 74a.

As is well understood by a person of ordinary skill in the art of CVD processes, high aspect ratio features within a surface, and particularly the inner side wall and bottom wall surfaces of such features, will not be completely coated by a film within a normal processing duration unless the film is directionalized or otherwise filtered, such as with a collimator. In the process chamber 10 illustrated in FIG. 2, no collimating structure exists between the showerhead electrode 20 where the plasma will generally be concentrated, and the side surfaces 72 of the insulative element 70, which are generally perpendicular to the plane of the showerhead 20 and substrate 18. Accordingly, there will generally be no directionality to the deposition on surface 72 and it will be random, as the plasma proximate surface 72 is random. Accordingly, the high aspect ratio grooves 74, and specifically the side wall 80 and bottom wall 78 surfaces of the grooves will remain free of a physically continuous, electrically conducting film, and thus the grooves 74 allow the insulative element 70 to maintain its electrically insulative qualities and thereby provide electrical isolation to the showerhead electrode with respect to the grounded chamber lid 14. Preferably, the element 70 will have features which have an effective aspect ratio of at least 10. An effective aspect ratio in the range of 10 to 20 has been found to be sufficient for the purposes of the invention.

In a preferred embodiment of the invention, multiple features, such as grooves 74, are utilized as illustrated in FIG. 2, each groove being continuous around the surface 72 to provide physical and electrical discontinuities to any film deposited on the surface 72. It is preferable to have multiple features, as one or more features may be covered with a continuous, electrically-conducting film, depending upon the duration of the PECVD process. For example, if the PECVD process is continued for a substantial amount of time, or if the plasma is particularly dense, one or more of the grooves 74 may become coated with a conducting film. Accordingly, it is desirable to have a plurality of grooves 74 formed within the surface 72 of the insulative element to provide multiple physical and electrical discontinuities and thereby maintain the electrical isolation of showerhead electrode 20. As is well understood, only one electrical discontinuity in a film on surface 72 is necessary for isolation of showerhead 20. Furthermore, in accordance with another principle of the present invention, it is desirable to utilize several of the grooves 74 in a position away from showerhead electrode 20 where the plasma will be most dense.

The features may be formed or fabricated on insulative element 70 by making the element thick enough to sustain deep, high aspect ratio features or by forming or raising thicker portions of the side walls of the element 70 as illustrated in FIG. 2.

The inventors, utilizing an embodiment of the present invention, as illustrated in the embodiment of FIG. 2, processed 700 wafers without experiencing significant plasma instabilities. Upon opening the process chamber 10, the electrical resistance along surface 72 was measured between the portions of surface 72 adjacent to the various grooves 74. The various sections of the surface 72 adjacent the grooves 74, are illustrated on the left side of FIG. 2 as surface sections 1–8. After processing 700 substrate wafers 18, that is, over 28 times the amount processed with the chamber illustrated in FIG. 1, the electrical resistance between the various surface sections 1–8 was measured. The results are in the following table.

TABLE 1

| Surface portion | SURFACE PORTIONS | | | | | | |
|---|---|---|---|---|---|---|---|
| | 1-2 | 2-3 | 3-4 | 4-5 | 5-6 | 6-7 | 7-8 |
| R (Ohms) | 11 | 32 | ∞ | 2k | ∞ | ∞ | ∞ |

As illustrated, the insulative element 70 of the invention prevents a continuous electrical path between the showerhead electrode 20 and lid 14. In that way, the showerhead electrode remains isolated in accordance with the principles of the present invention. Only two grooves, that is, the groove between surfaces 1–2 and between surfaces 2–3, formed an electrically conducting path. All of the other grooves provided suitable electrical discontinuities in the film on surface 72 to maintain the insulative properties of the electrode support 70. The space between sections 4 and 5 was wide and did not have as high of an aspect ratio as the other high aspect ratio features formed in accordance with the principles of the present invention.

A preferred embodiment of the invention as illustrated in the figures, utilizes circular grooves formed around the cylindrical surface 72 of element 70. However, the term "feature" herein is not limited to the groove structure 74 illustrated in FIGS. 2 and 3. Rather, feature is defined herein as any structure formed within the insulative surface of the insulative element 70 and having a sufficiently high effective aspect ratio to inhibit the deposition of a film therein and thereby create an electrical discontinuity in the film deposited on an outer surface 72. For example, a feature as discussed herein, and as recited in the claims of the application, may include a plurality of holes or pores which are coupled together to provide an effective electrical discontinuity in a film formed in the surface of the insulative electrode support.

Furthermore, the features 74 in element 70, consistent with the invention, do not have to be geometric. That is, the features do not have to have flat bottom surfaces 78 or side wall surfaces 80, and they do not have to be rectangular as shown. For example, sloped side wall and bottom surfaces would be suitable as long as the effective depths and widths of the features yield effective aspect ratios suitable to prevent a continuous, electrically conducting film from being deposited between two elements, such as grounded lid 14 and RF biased showerhead 20. The aspect ratio necessary may also depend on the duration of the process. Longer processes may require higher aspect ratios.

In accordance with another principle of the present invention, the aspect ratios of adjacent features, such as grooves 74a, 74b, 74c, as illustrated in FIG. 3, may be varied. For example, groove 74a is wider than groove 74b which, in turn, is wider than groove 74c. Accordingly, the various features 74 formed with high aspect ratio geometries, in accordance with the principles of the present invention, may have varying aspect ratios. Furthermore, while a plurality of grooves 74 are shown in the embodiments of FIGS. 2 and 3, a single structure, such as a single groove, may be sufficient to prevent deposition therein and thus create an electrical discontinuity in any film coating the surface 72. In such a case, multiple high aspect ratio features will not be necessary.

While the present invention has been illustrated by the description of the embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details representative apparatus and method, and illustrative examples shown and described. Accordingly, departures may be made from such details without departure from the spirit or scope of applicant's general inventive concept.

What is claimed is:

1. An apparatus for depositing a film on a substrate utilizing a deposition process, the apparatus comprising:
   a process chamber having an electrically grounded element therein;
   a substrate support for supporting a substrate within the process chamber;
   a showerhead electrode positioned in the process chamber proximate the substrate support, the showerhead electrode configured for introducing a process gas and for being biased with RF energy for creating a plasma within the process chamber for plasma enhanced chemical vapor deposition;
   an electrically insulative cylinder coupled between the showerhead electrode and the grounded element and configured for directing process gas to the showerhead electrode, the insulative cylinder being formed of an electrically insulative material and having an insulative surface for effectively electrically isolating the electrode from the grounded element within the process chamber;
   the insulative cylinder including at least one feature formed in the insulative surface to circle continuously around the cylinder, the feature having a high effective aspect ratio for inhibiting the deposition of a film therein to thereby create an electrical discontinuity in a film which may form on the insulative surface during the plasma-enhanced chemical vapor deposition process;
   whereby the insulative properties of the insulative cylinder are maintained to maintain the electrical isolation of the electrode.

2. The apparatus of claim 1 further comprising a plurality of features formed in the insulative cylinder to define a series of electrical discontinuities in a film which may form on the insulative surface.

3. The apparatus of claim 2 wherein at least one of said features has a different aspect ratio from another of said features.

4. The apparatus of claim 1 wherein said feature is in the form of a groove.

5. The apparatus of claim 1 wherein said feature is generally circular to extend continuously around the cylinder.

6. The apparatus of claim 2 wherein said plurality of features are divided into at least two groups which are spatially separated from each other on the insulative surface.

7. The apparatus of claim 1 wherein said feature has an effective aspect ratio of at least 10.

8. The apparatus of claim 1 wherein said feature has an effective aspect ratio in the range of 10 to 20.

9. A method for depositing a film on a substrate utilizing a deposition process, the method comprising:
   positioning a substrate within a process chamber having an electrically grounded element therein;
   biasing a showerhead electrode in the process chamber with RF energy for creating a plasma proximate the substrate within the process chamber for plasma enhanced chemical vapor deposition of a film onto the substrate;
   positioning an electrically insulative cylinder between the showerhead electrode and the grounded element and directing process gas to the showerhead electrode through the cylinder, the insulative cylinder being formed of an electrically insulative material and having an insulative surface for effectively electrically isolating the electrode from the grounded element within the process chamber;
   providing at least one feature formed in the insulative surface to circle continuously around the cylinder wherein the feature has a high effective aspect ratio for inhibiting the deposition of a film therein to thereby create an electrical discontinuity in a film which may form on the insulative surface during the plasma enhanced chemical vapor deposition;
   whereby the insulative properties of the insulative cylinder are maintained to maintain electrical isolation of the electrode when a film is deposited on the substrate.

10. The method of claim 9 further comprising utilizing a plurality of features formed in the insulative cylinder to define a series of electrical discontinuities in a film which may form on the insulative surface.

11. The method of claim 9 wherein said insulative cylinder is formed of an electrically insulative material including at least one of the group of quartz, alumina and aluminum nitride.

12. The method of claim 10 wherein at least one of said features has a different aspect ratio from another of said features.

13. The method of claim 9 wherein said feature is in the form of a groove.

14. The method of claim 9 wherein said feature has an effective aspect ratio of at least 10.

15. The method of claim 9 wherein said feature has an effective aspect ration in the range of 10 to 20.

* * * * *